(12) United States Patent
Hsu

(10) Patent No.: US 12,295,144 B2
(45) Date of Patent: *May 6, 2025

(54) SILICON-OXIDE-NITRIDE-OXIDE-SILICON MEMORY CELL

(71) Applicant: UNITED MICROELECTRONICS CORP., Hsin-Chu (TW)

(72) Inventor: Chia-Ching Hsu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/602,040

(22) Filed: Mar. 12, 2024

(65) Prior Publication Data

US 2024/0215251 A1 Jun. 27, 2024

Related U.S. Application Data

(60) Continuation of application No. 17/706,577, filed on Mar. 28, 2022, now Pat. No. 11,956,966, which is a division of application No. 17/177,164, filed on Feb. 16, 2021, now Pat. No. 11,621,271.

(51) Int. Cl.
| | |
|---|---|
| *H10B 43/35* | (2023.01) |
| *H10D 30/01* | (2025.01) |
| *H10D 30/69* | (2025.01) |
| *H10D 64/01* | (2025.01) |

(52) U.S. Cl.
CPC ......... *H10B 43/35* (2023.02); *H10D 30/0413* (2025.01); *H10D 30/69* (2025.01); *H10D 30/696* (2025.01); *H10D 64/037* (2025.01)

(58) Field of Classification Search
CPC ............... H10B 43/35; H01L 21/8239; H01L 29/40117; H01L 29/42344; H01L 29/66833; H01L 29/792
See application file for complete search history.

(56) References Cited

U.S. PATENT DOCUMENTS

| | | | |
|---|---|---|---|
| 8,471,328 B2 | 6/2013 | Chen | |
| 8,848,454 B2 | 9/2014 | Tsai | |
| 9,159,844 B2 | 10/2015 | Lee | |
| 10,332,884 B2 | 6/2019 | Yi | |
| 2004/0145009 A1 | 7/2004 | Min | |
| 2006/0035432 A1* | 2/2006 | Kim | H10B 43/40 438/257 |
| 2008/0145985 A1 | 6/2008 | Chi | |
| 2009/0050956 A1 | 2/2009 | Ishimaru | |
| 2016/0111510 A1 | 4/2016 | Tseng | |
| 2019/0067302 A1 | 2/2019 | Wu | |

* cited by examiner

*Primary Examiner* — Mohammad M Choudhry
(74) *Attorney, Agent, or Firm* — Winston Hsu

(57) ABSTRACT

A silicon-oxide-nitride-oxide-silicon (SONOS) memory cell includes a memory gate disposed on a substrate, a dielectric layer and two charge trapping layers, wherein the dielectric layer is disposed between the substrate and the memory gate, and the two charge trapping layers are disposed at two opposite sides of the memory gate, wherein each of the charge trapping layers comprises an L-shape cross-sectional profile, and two selective gates disposed on the substrate, thereby constituting a two bit memory cell, wherein a top surface of each selective gate is higher than a top surface of the memory gate.

18 Claims, 6 Drawing Sheets

SILICON-OXIDE-NITRIDE-OXIDE-SILICON MEMORY CELL

CROSS REFERENCE TO RELATED APPLICATIONS

This application is a continuation application of U.S. application Ser. No. 17/706,577, filed on Mar. 28, 2022, which is a division of U.S. application Ser. No. 17/177,164, filed on Feb. 16, 2021. The contents of these applications are incorporated herein by reference.

BACKGROUND OF THE INVENTION

1. Field of the Invention

The present invention relates generally to a memory cell and forming method thereof, and more specifically to a two bit silicon-oxide-nitride-oxide-silicon (SONOS) memory cell and forming method thereof.

2. Description of the Prior Art

Memory is divided into two categories: volatile memory and non-volatile memory. In nowadays, the two important types of volatile memory are static random access memory (SRAM) and dynamic random access memory (DRAM). There are many types of non-volatile memory. Flash memory is the most popular type, and other types may include silicon-oxide-nitride-oxide-silicon (SONOS), ferroelectric random access memory (FRAM), phase-change random access memory (PRAM), magnetoresistive access memory (MRAM) and resistive random access memory (RRAM).

SUMMARY OF THE INVENTION

The present invention provides a silicon-oxide-nitride-oxide-silicon (SONOS) memory cell and forming method thereof, which includes two charge trapping layers at two ends of a dielectric layer sandwiched by a substrate and a memory gate to constitute a two bit memory cell.

The present invention provides a silicon-oxide-nitride-oxide-silicon (SONOS) memory cell including a memory gate, a dielectric layer, two charge trapping layers and two selective gates. The memory gate is disposed on a substrate. The two charge trapping layers are at two ends of the dielectric layer, and the charge trapping layers and the dielectric layer are sandwiched by the substrate and the memory gate. The two selective gates are disposed at two opposite sides of the memory gate, thereby constituting a two bit memory cell.

The present invention provides a method of forming a silicon-oxide-nitride-oxide-silicon (SONOS) memory cell including the following steps. A first dielectric layer and a first electrode layer are deposited on a substrate sequentially. The first electrode layer and the first dielectric layer are patterned, to form a second dielectric layer and an electrode layer stacked from bottom to top. Two ends of the second dielectric layer are removed, so that a dielectric layer being formed, wherein the electrode layer protrudes from the dielectric layer. Two charge trapping layers are formed on sidewalls of the dielectric layer and the electrode layer, so that the charge trapping layers have L-shaped cross-sectional profiles. Two selective gates are formed at two opposite sides of the charge trapping layers, thereby constituting a two bit memory cell, wherein FN tunneling is induced while erasing.

According to the above, the present invention provides a silicon-oxide-nitride-oxide-silicon (SONOS) memory cell and forming method thereof, which includes a memory gate disposed on a substrate, two charge trapping layers at two ends of a dielectric layer sandwiched by the substrate and the memory gate, and two selective gates disposed at two opposite sides of the memory gate, to constitute a two bit memory cell. This device has high injection efficiency and low current consumption during programming. Sensing ability is kept while erasing, and threshold voltage is stable while programming and erasing.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
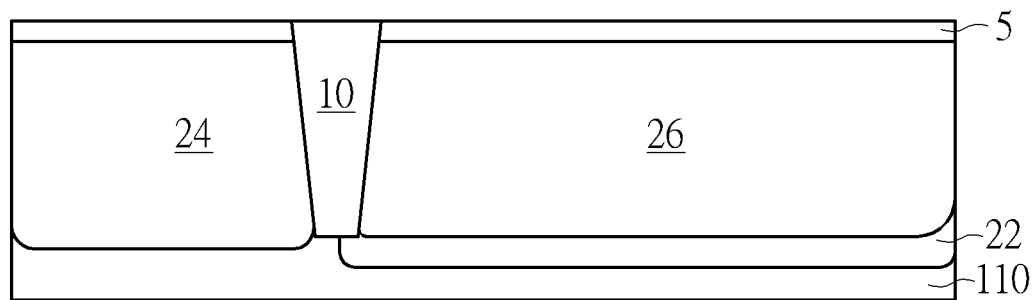
FIG. 1 schematically depicts a cross-sectional view of a method of forming a silicon-oxide-nitride-oxide-silicon (SONOS) memory cell according to an embodiment of the present invention.

FIGS. 1-11 schematically depict cross-sectional views of a method of forming a silicon-oxide-nitride-oxide-silicon (SONOS) memory cell according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The substrate 110 may be divided into a first area A and a second area B, depending upon their functions. In this embodiment, the first area A is a memory cell area while the second area B is a logic area, wherein the circuits in the logic area are used for operating the memory cells in the memory cell area, but it is not limited thereto.

Furthermore, a first dielectric layer 5 may be deposited on the substrate 110, and then an isolation structure 10 is formed in the substrate 110, wherein the first dielectric layer 5 may be a pad oxide layer, and the isolation structure 10 may be a shallow trench isolation (STI) structure, which is formed by a shallow trench isolation (STI) process, but it is not restricted thereto. Optionally, a deep well 22 in the first area A and a logic Vt well 24 in the second area B are formed in the substrate 110, and then a cell Vt well 26 is implanted in the first area A in this case.

Figure 2:
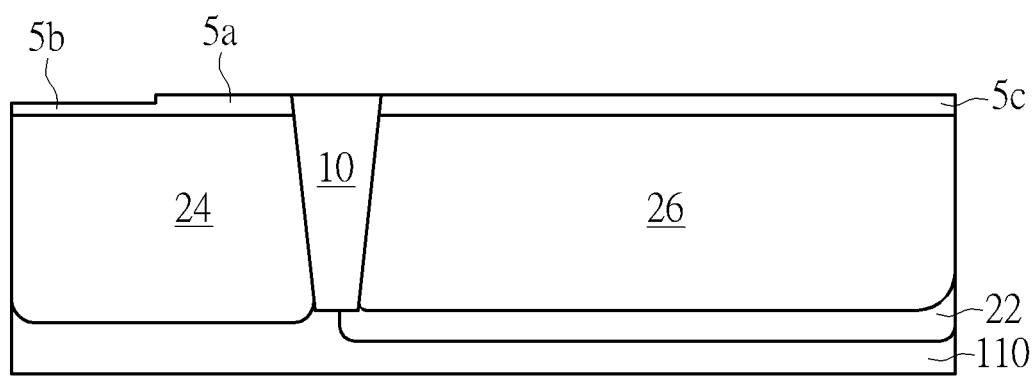
FIG. 2 schematically depicts a cross-sectional view of a method of forming a silicon-oxide-nitride-oxide-silicon (SONOS) memory cell according to an embodiment of the present invention.

As shown in FIG. 2, the second area B may be divided into an IO area B1 and a core area B2. The first dielectric layer 5 in the IO area B1 and the core area B2 are replaced by an IO dielectric layer 5a and a core dielectric layer 5b respectively, and a first dielectric layer 5c remains. The IO dielectric layer 5a and the core dielectric layer 5b may be also oxides, which may be formed by different methods. For example, the first dielectric layer 5 in the IO area B1 and the core area B2 is removed, and then the IO dielectric layer 5a may be deposited or thermally growth on the substrate 110 of the IO area B1 and the core area B2 first, and the IO dielectric layer 5a in the core area B2 is removed, and then the core dielectric layer 5b in the core area B2 is deposited or thermally growth, but it is not limited thereto.

Figure 3:
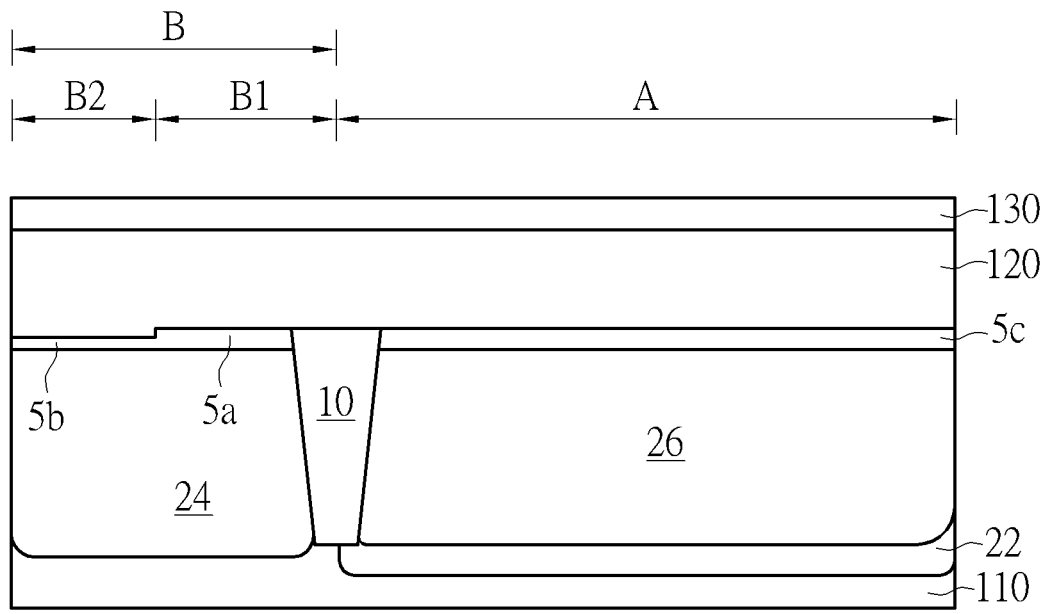
FIG. 3 schematically depicts a cross-sectional view of a method of forming a silicon-oxide-nitride-oxide-silicon (SONOS) memory cell according to an embodiment of the present invention.
Figure 4:
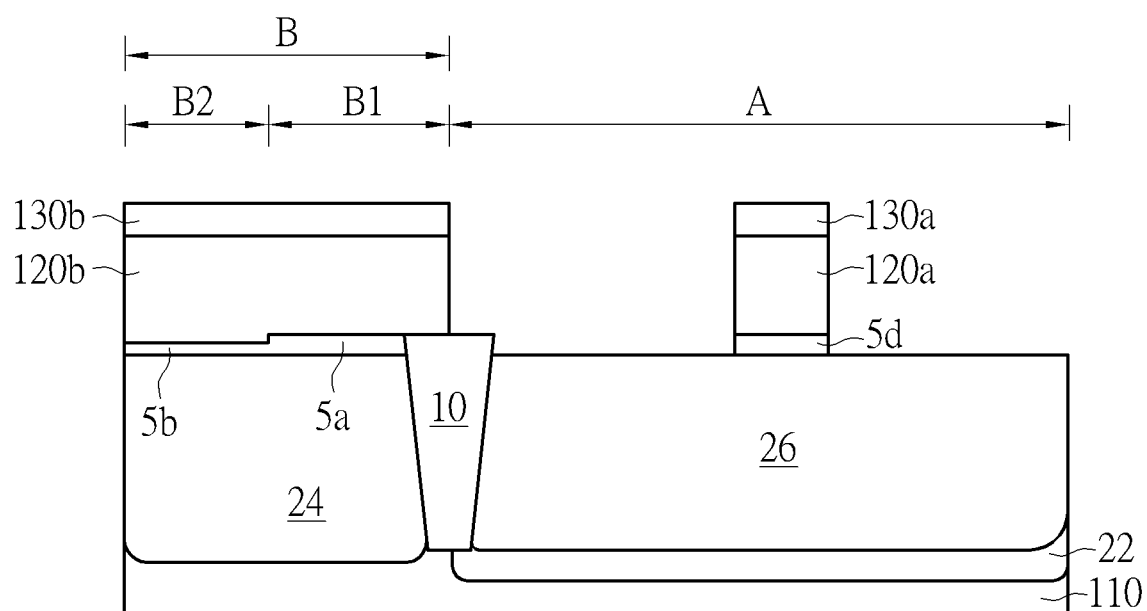
FIG. 4 schematically depicts a cross-sectional view of a method of forming a silicon-oxide-nitride-oxide-silicon (SONOS) memory cell according to an embodiment of the present invention.

As shown in FIG. 3, a first electrode layer 120 and a hard mask layer 130 are deposited blanketly in the memory area A, the IO area B1 and the core area B2. The hard mask layer 130 is deposited for patterning the first electrode layer 120 and the first dielectric layer 5c. In this embodiment, the first electrode layer 120 is a polysilicon layer, and the hard mask layer 130 a silicon nitride layer, but it is not limited thereto. Thus, the hard mask layer 130, the first electrode layer 120 and the first dielectric layer 5c are patterned using methods such as photolithography and etching processes, so that a second dielectric layer 5d, an electrode layer 120a and a hard mask layer 130a stacked from bottom to top in the first area A, and the IO dielectric layer 5a, the core dielectric layer 5b, an electrode layer 120b and a hard mask layer 130b stacked in the second area B are formed, as shown in FIG. 4.

Figure 5:
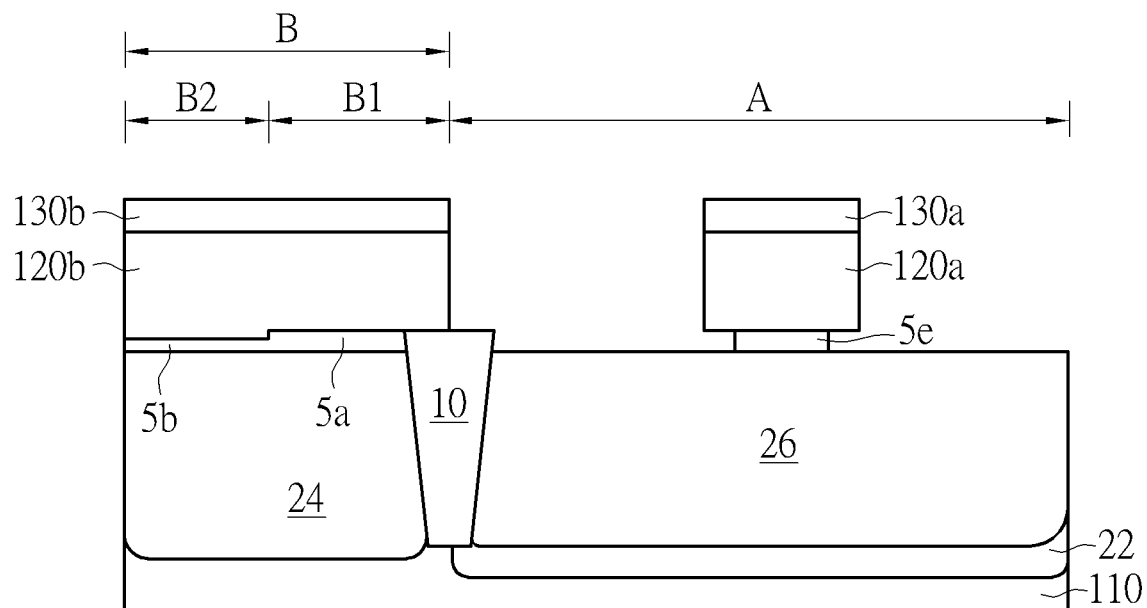
FIG. 5 schematically depicts a cross-sectional view of a method of forming a silicon-oxide-nitride-oxide-silicon (SONOS) memory cell according to an embodiment of the present invention.

Two ends of the second dielectric layer 5d are removed, so that a dielectric layer 5e being formed, thereby the electrode layer 120a protruding from the dielectric layer 5e, as shown in FIG. 5. In a preferred embodiment, the two ends of the second dielectric layer 5d are removed by wet etching, but the present invention is not restricted thereto.

Figure 6:
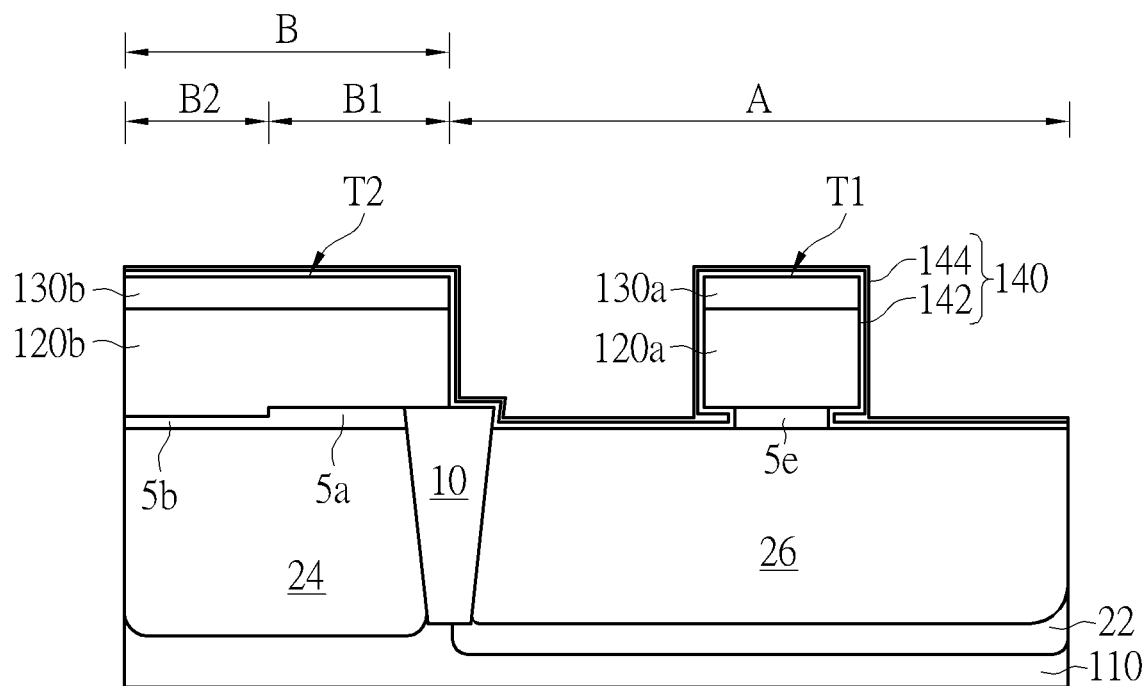
FIG. 6 schematically depicts a cross-sectional view of a method of forming a silicon-oxide-nitride-oxide-silicon (SONOS) memory cell according to an embodiment of the present invention.
Figure 7:
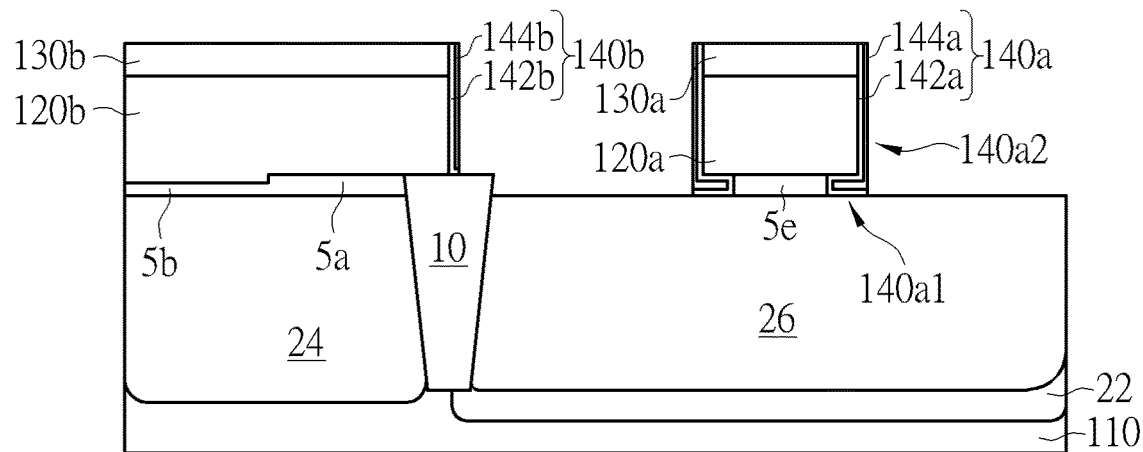
FIG. 7 schematically depicts a cross-sectional view of a method of forming a silicon-oxide-nitride-oxide-silicon (SONOS) memory cell according to an embodiment of the present invention.

Please refer to FIGS. 6-7, two charge trapping layers 140a are formed on sidewalls of the dielectric layer 5e, the electrode layer 120a and the hard mask layer 130a. More precisely, as shown in FIG. 6, a charge trapping material layer 140 conformally covers the substrate 110, the dielectric layer 5e, the electrode layer 120a, the hard mask layer 130a in the first area A and the electrode layer 120b and the hard mask layer 130b in the second area B. Then, a part of the charge trapping material layer 140 covering the substrate 110, a top surface of the hard mask layer 130a, and a top surface of the hard mask layer 130b is removed to form the charge trapping layers 140a on the sidewalls of the dielectric layer 5e, the electrode layer 120a and the hard mask layer 130a, as shown in FIG. 7.

Since the electrode layer 120a protrudes from the dielectric layer 5e, the charge trapping layers 140a have L-shaped cross-sectional profiles. Besides, each of the L-shape cross-sectional profile has a bottom part 140a1 and a vertical part 140a2. Due to an oxide layer 142 and a nitride layer 144 being deposited sequentially to conformally cover the electrode layer 120a and the dielectric layer 5e in this embodiment, the bottom part 140a1 of the L-shape cross-sectional profile has three layers composed of oxide/nitride/oxide layers (that is an oxide layer 142a surrounds a nitride layer 144a) while the vertical part 140a2 of the L-shape cross-sectional profile has two layers composed of oxide/nitride layers (that is the oxide layer 142a sandwiched by the nitride layer 144a and the electrode layer 120a and the hard mask layer 130a), but the present invention is not restricted thereto. Meanwhile, a charge trapping layer 140b including an oxide layer 142b and a nitride layer 144b is also formed on sidewalls of the electrode layer 120a and the hard mask layer 130a.

Figure 8:
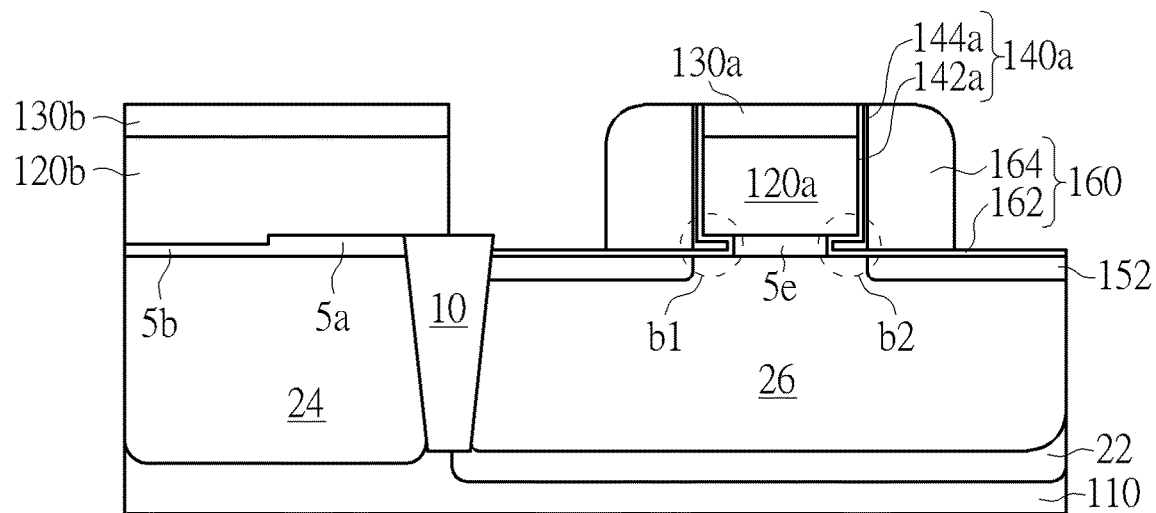
FIG. 8 schematically depicts a cross-sectional view of a method of forming a silicon-oxide-nitride-oxide-silicon (SONOS) memory cell according to an embodiment of the present invention.

As shown in FIG. 8, selective gate regions 152 are doped in the substrate 110 at the two opposite sides of the charge trapping layers 140a. Then, two selective gates 160 including selective dielectric layers 162 and selective electrodes 164 are formed on the substrate 110 at two opposite sides of the charge trapping layers 140a, thereby constituting a two bit (b1/b2) memory cell. In one case, the selective dielectric layer 162 may be formed on the substrate 110 by thermal oxide or chemical oxide processes, and a selective electrode layer is deposited blanketly and then patterned to form the selective electrodes 164 on the selective dielectric layer 162 beside the charge trapping layers 140a. In this case, the selective dielectric layer 162 includes oxide, and the selective electrodes 164 include polysilicon, but it is not limited thereto.

Figure 9:
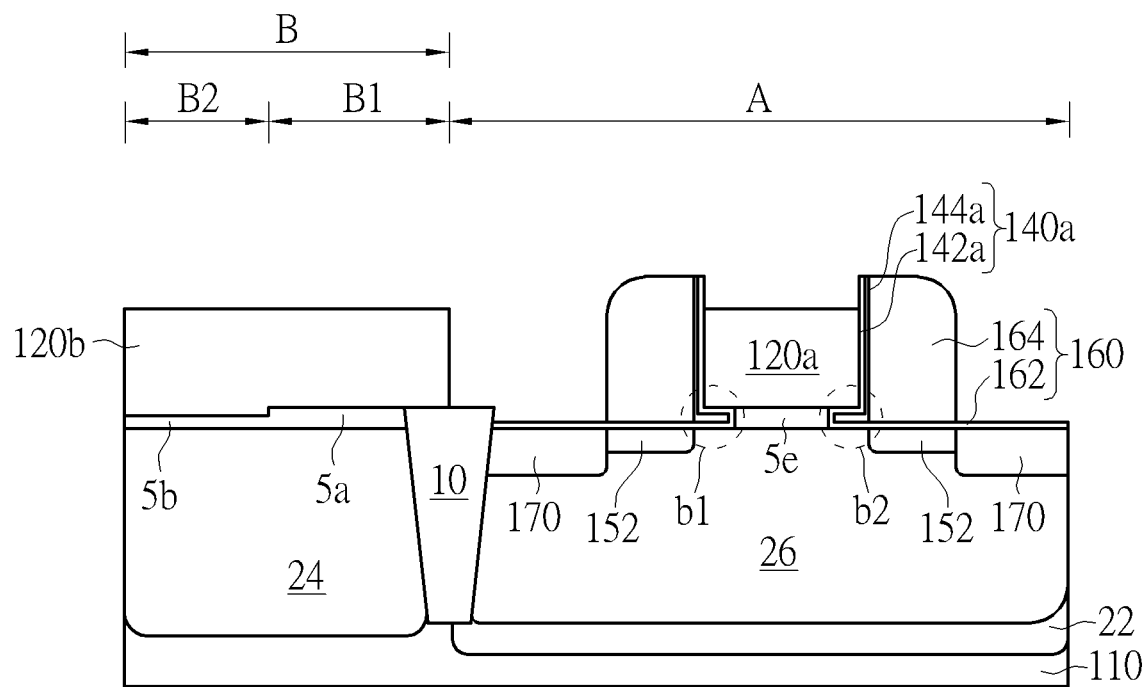
FIG. 9 schematically depicts a cross-sectional view of a method of forming a silicon-oxide-nitride-oxide-silicon (SONOS) memory cell according to an embodiment of the present invention.
Figure 10:
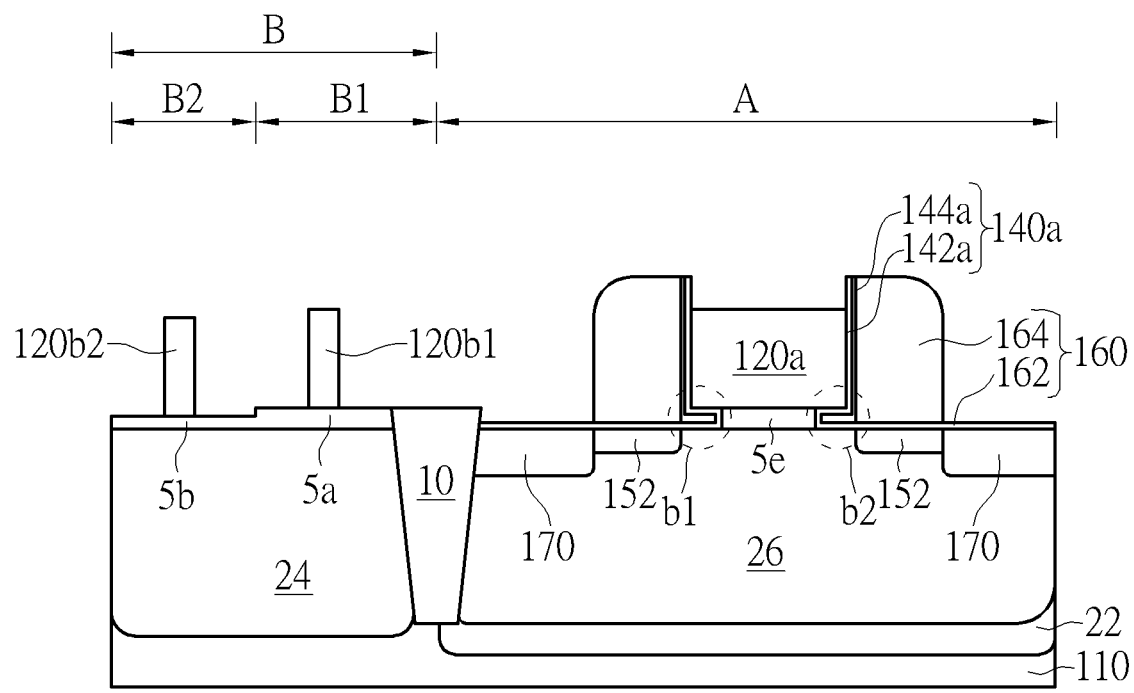
FIG. 10 schematically depicts a cross-sectional view of a method of forming a silicon-oxide-nitride-oxide-silicon (SONOS) memory cell according to an embodiment of the present invention.

Lightly doped source/drain regions 170 are formed in the substrate 110 beside two opposite sides of the two selective gates 160 after the selective gates 160 are formed, as shown in FIG. 9. Thereafter, the hard mask layers 130a/130b are removed, so that the first electrode layer 120a and the first electrode layer 120b are exposed. The first electrode layer 120b in the IO area B1 and the core area B2 is patterned to form an IO gate electrode 120b1 in the IO area B1 and a core gate electrode 120b2 in the core area B2 after the selective gates 160 are formed, as shown in FIG. 10.

Figure 11:
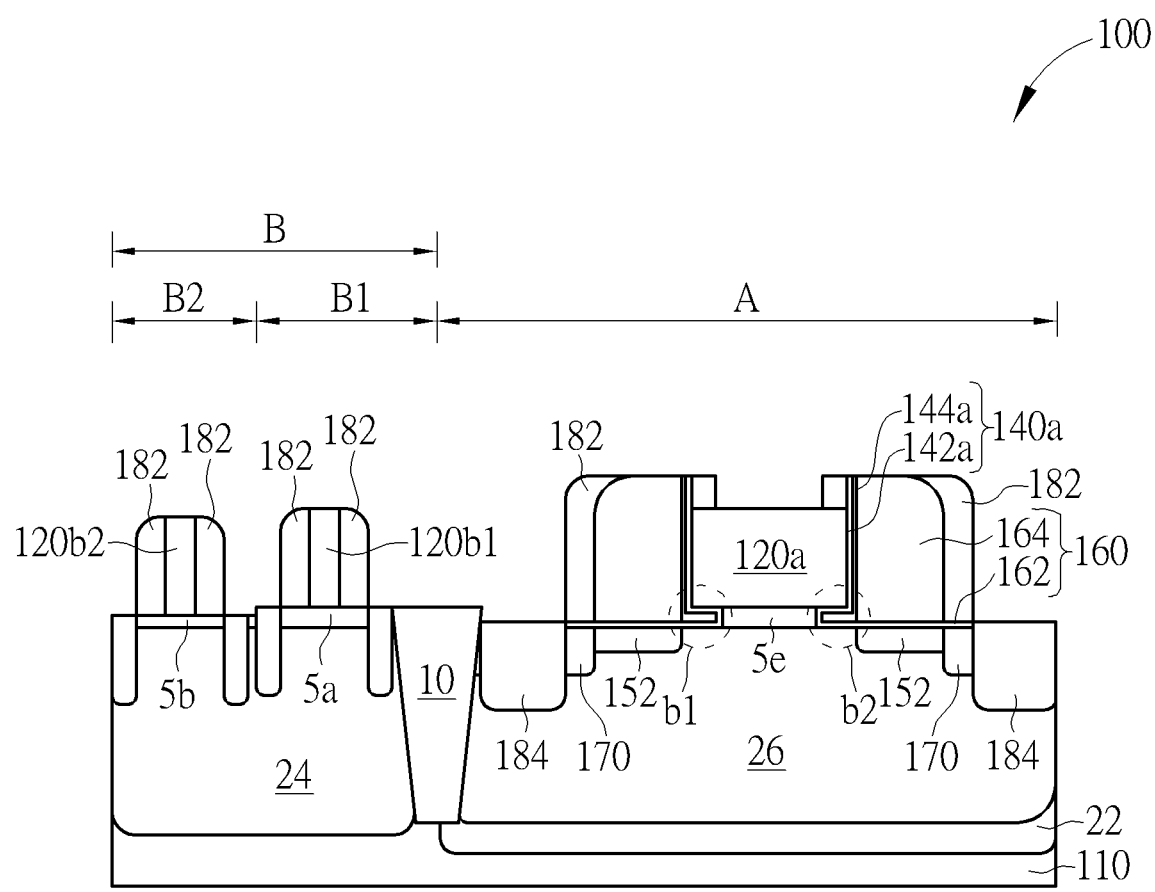
FIG. 11 schematically depicts a cross-sectional view of a method of forming a silicon-oxide-nitride-oxide-silicon (SONOS) memory cell according to an embodiment of the present invention.

As shown in FIG. 11, spacers 182 are formed on the substrate 110 beside the two selective gates 160, the IO gate electrode 120b1 and the core gate electrode 120b2 at a same time in this embodiment. The spacers 182 may be respectively formed beside the two selective gates 160, the IO gate electrode 120b1 and the core gate electrode 120b2 instead. The spacers 182 may be single layer spacers or multilayer spacers, which may be composed of oxide or nitride etc, depending upon practical requirements. Source/drain regions 184 are doped in the substrate 110 beside the spacers 182. Thus, a silicon-oxide-nitride-oxide-silicon (SONOS) memory cell 100 of two bits is carried out, and later processes may be performed, which are well known in the art and are not described. In one case, FN tunneling may be induced in the silicon-oxide-nitride-oxide-silicon (SONOS) memory cell 100 while erasing. By applying the present invention, injection efficiency is improved and low current consumption is achieved during programming, sensing ability can be kept while erasing, and threshold voltage is stable while programming and erasing.

To summarize, the present invention provides a silicon-oxide-nitride-oxide-silicon (SONOS) memory cell and forming method thereof, which includes a memory gate disposed on a substrate, two charge trapping layers at two ends of a dielectric layer sandwiched by the substrate and the memory gate, and two selective gates disposed at two opposite sides of the memory gate, to constitute a two bit memory cell. This device has high injection efficiency and low current consumption during programming. Sensing ability is kept while erasing, and threshold voltage is stable while programming and erasing.

Furthermore, each of the charge trapping layers preferably has an L-shape cross-sectional profile, wherein a bottom part of the L-shape cross-sectional profile is sandwiched by the substrate and the memory gate for constituting a two bit memory cell, and a vertical part of the L-shape cross-sectional profile is sandwiched by the corresponding selective gate and the memory gate, for isolating the memory gate from the corresponding selective gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A silicon-oxide-nitride-oxide-silicon (SONOS) memory cell, comprising:
   a memory gate disposed on a substrate;
   a dielectric layer and two charge trapping layers, wherein the dielectric layer is disposed between the substrate and the memory gate, and the two charge trapping layers are disposed at two opposite sides of the memory gate, wherein each of the charge trapping layers comprises an L-shape cross-sectional profile; and
   two selective gates disposed on the substrate, thereby constituting a two bit memory cell, wherein a top surface of each selective gate is higher than a top surface of the memory gate, wherein the two charge trapping layers are disposed between the two selective gates.

2. The silicon-oxide-nitride-oxide-silicon (SONOS) memory cell according to claim 1, wherein the dielectric layer comprises an oxide layer.

3. The silicon-oxide-nitride-oxide-silicon (SONOS) memory cell according to claim 1, wherein the memory gate is disposed between the two selective gates.

4. The silicon-oxide-nitride-oxide-silicon (SONOS) memory cell according to claim 1, wherein the L-shape cross-sectional profile has a bottom part and a vertical part.

5. The silicon-oxide-nitride-oxide-silicon (SONOS) memory cell according to claim 4, wherein the bottom part is sandwiched by the substrate and the memory gate, and the vertical part is sandwiched by the corresponding selective gate and the memory gate.

6. The silicon-oxide-nitride-oxide-silicon (SONOS) memory cell according to claim 1, wherein the charge trapping layers comprise oxide/nitride/oxide layers.

7. The silicon-oxide-nitride-oxide-silicon (SONOS) memory cell according to claim 1, further comprising:
   two spacers disposed on the substrate beside the two selective gates respectively.

8. The silicon-oxide-nitride-oxide-silicon (SONOS) memory cell according to claim 7, wherein each spacer contacts one of the two selective gates directly.

9. The silicon-oxide-nitride-oxide-silicon (SONOS) memory cell according to claim 7, further comprising:
   a source/drain region disposed in the substrate beside two opposite sides of the spacers respectively.

10. The silicon-oxide-nitride-oxide-silicon (SONOS) memory cell according to claim 1, further comprising:
    lightly doped source/drain regions disposed in the substrate beside two opposite sides of the selective gates respectively.

11. The silicon-oxide-nitride-oxide-silicon (SONOS) memory cell according to claim 1, further comprising a hard mask layer disposed on the memory gate.

12. The silicon-oxide-nitride-oxide-silicon (SONOS) memory cell according to claim 11, wherein a top surface of the hard mask layer is aligned with the top surface of each selective gate.

13. The silicon-oxide-nitride-oxide-silicon (SONOS) memory cell according to claim 1, further comprising a memory cell area and a logic area defined on the substrate, wherein the memory gate, the two charge trapping layers and the two selective gates are disposed in the memory cell area.

14. The silicon-oxide-nitride-oxide-silicon (SONOS) memory cell according to claim 13, further comprising another electrode layer disposed in the logic area.

15. The silicon-oxide-nitride-oxide-silicon (SONOS) memory cell according to claim 14, further comprising an IO dielectric layer and a core dielectric layer disposed between the substrate and the another electrode layer in the logic area.

16. The silicon-oxide-nitride-oxide-silicon (SONOS) memory cell according to claim 15, wherein a thickness of the IO dielectric layer and a thickness of the core dielectric layer in the logic area are different.

17. The silicon-oxide-nitride-oxide-silicon (SONOS) memory cell according to claim 14, wherein a top surface of the electrode layer disposed in the logic area is aligned with the top surface of the memory gate in the memory cell area.

18. The silicon-oxide-nitride-oxide-silicon (SONOS) memory cell according to claim 13, further comprising an isolation structure disposed in the substrate and disposed between the memory cell area and the logic area.

* * * * *